United States Patent
Palmer et al.

(10) Patent No.: US 7,978,924 B2
(45) Date of Patent: *Jul. 12, 2011

(54) SYSTEMS AND METHODS FOR OPTIMIZING BIT UTILIZATION IN DATA ENCODING

(75) Inventors: Stephen C. Palmer, West Chester, PA (US); Richard Wyatt, West Chester, PA (US)

(73) Assignee: Verizon Services Corp., Ashburn, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/780,354

(22) Filed: May 14, 2010

(65) Prior Publication Data

US 2010/0219994 A1 Sep. 2, 2010

Related U.S. Application Data (63) Continuation of application No. 11/474,990, filed on Jun. 27, 2006, now Pat. No. 7,738,717.

(51) Int. Cl.
*G06K 9/36* (2006.01)

(52) U.S. Cl. ....................................................... 382/245
(58) Field of Classification Search .......... 382/182–183, 382/232–233, 237, 240, 243–245; 341/50, 341/90, 106; 235/435
See application file for complete search history.

(56) References Cited

U.S. PATENT DOCUMENTS

| | | | | |
|---|---|---|---|---|
| 4,670,890 A | * | 6/1987 | Titchener | 375/359 |
| 7,738,717 B1 | * | 6/2010 | Palmer et al. | 382/245 |

* cited by examiner

*Primary Examiner* — Jose L Couso (57) ABSTRACT

In one of many possible embodiments, a system for optimizing bit utilization in data encoding is provided. The exemplary system includes a data processing subsystem configured to identify a total number of unique characters within a set of data, which number represents an original base of representation of the set of data. The data processing subsystem is further configured to convert the set of data to a base of representation that is higher than the original base of representation and then encode the base-converted data with a fixed-length encoding scheme.

24 Claims, 5 Drawing Sheets

SYSTEMS AND METHODS FOR OPTIMIZING BIT UTILIZATION IN DATA ENCODING

RELATED APPLICATION

This application is a continuation of, and claims priority to, co-pending application Ser. No. 11/474,990, filed Jun. 27, 2006, and entitled "SYSTEMS AND METHODS FOR OPTIMIZING BIT UTILIZATION IN DATA ENCODING," the contents of which are hereby incorporated herein by reference in their entirety.

BACKGROUND INFORMATION

The advent of computers, interactive electronic communication, the Internet, and other advances in the digital realm of consumer electronics have resulted in a need for digital data encoding techniques that are accurate and efficient.

Fixed length encoding is one type of data encoding technique that is commonly used to store and transmit digital data. In fixed length encoding, a number of digital bit patterns of fixed lengths are used to define the characters or symbols of a written language, thus allowing digital devices to store, process, and communicate character-oriented information.

Common fixed length encoding schemes include, but are not limited to, the American Standard Code for Information Interchange (ASCII), extended-ASCII, Extended Binary-Coded Decimal Interchange Code (EBCDIC), and Unicode. In ASCII, for example, a seven bit encoding scheme is used to represent ninety-four printable characters including letters, numbers, and punctuation symbols in addition to thirty-four control characters and other "special characters." In extended-ASCII, an eighth bit is added to the encoding scheme to facilitate representation of 128 additional symbols.

Fixed length encoding is used to store and transmit all types of data. For example, fixed length encoding is often used to store and transmit large compilations of text and/or numbers, such as names, telephone numbers, credit card numbers, social security numbers, and other identification numbers.

However, fixed length encoding is inherently inefficient when used to encode certain types of data. For example, when decimal data (i.e., data that includes the digits between 0 and 9) is stored using extended-ASCII encoding, fifty percent or more of the consumed storage medium may be wasted on bits that are not necessary to represent the data. Moreover, the encoding of large data files often requires large storage media and time-consuming data processing.

BRIEF DESCRIPTION OF THE DRAWINGS

The accompanying drawings illustrate various embodiments and are a part of the specification. The illustrated embodiments are merely examples and do not limit the scope of the disclosure. Throughout the drawings, identical reference numbers designate identical or similar elements.

DETAILED DESCRIPTION OF PREFERRED EMBODIMENTS

I. Introduction

Systems and methods for optimizing bit utilization in data encoding are described herein. A set of data that is to be encoded is first analyzed to identify the total number of unique characters contained therein. The total number of unique characters may then be designated as an original base of representation of the set of data. The set of data is then converted to a base of representation that is higher than the original base of representation. The base-converted data may then be encoded with any suitable fixed-length encoding scheme.

In certain embodiments, by converting the set of data to a higher base of representation prior to encoding, the systems and methods described herein optimize bit utilization by reducing the number of characters that are encoded. In some examples, the higher base of representation may be chosen to optimize the bit utilization of the encoding system. For example, the set of data may be converted into a base of representation that is the highest power of the original base of representation permitted by the length of the particular encoding scheme.

To facilitate an understanding of the systems and methods described herein, a number of terms related to number systems, fixed length encoding, and bit utilization will now be described.

A. Number Systems

As used herein, the term "number system" will be used to refer to a set of rules used to map a numeral to a number. A "number" is an ideal or conceptual quantitative value. A "numeral" is a symbol used to visually represent a number. For example, in certain number systems the numerals 1 and $0.\overline{999}$ both represent the same number, one.

The "base" or "radix" of a particular number system refers to the quantity of digits, including zero, that the number system uses to represent a number. For example, the decimal number system, one of the most commonly used number systems, has a base of representation equal to 10. Hence, the maximum number a single digit in the decimal number system will ever reach is 9, after which it becomes necessary to add another digit to represent a higher number.

An n digit decimal number is represented by the equation given in Equation 1.

$$\sum_{i=0}^{n-1} d_i 10^i \qquad \text{Equation 1}$$

The variable $d_i$ shown in Equation 1 represents each digit in the n digit decimal number. For example, the number "1234" includes four digits—$d_0$ is 4, $d_1$ is 3, $d_2$ is 2, and $d_3$ is 1.

Equation 1 may be generalized to represent an n digit number in any number system. In general, an n digit number in a number system of base B may be represented by the equation given in Equation 2.

$$\sum_{i=0}^{n-1} d_i B^i \qquad \text{Equation 2}$$

As the base of representation increases, the number of digits needed to represent a particular number decreases. For example, three digits are required to represent the number "seven" in binary, or base 2. However, in decimal, or base 10, only one digit is needed to represent the number "seven." Equation 3 shows a formula that may be used to calculate the number of digits needed to represent a number N with radix r:

$$\lceil \log_r(N+1) \rceil \qquad \text{Equation 3}$$

A number may be represented using any number system as may serve a particular application. Moreover, a number may be converted from one base of representation to another (e.g., from binary to decimal or vice versa). In some examples, conversion from one base of representation to another may be performed by using one of a number of different algorithms and/or look-up tables.

B. Fixed Length Encoding

Fixed length encoding is a method of representing characters or symbols in a way that can be manipulated by a digital device, such as a computer. In fixed length encoding, a number of bits are first grouped into elements of a specified size. Each permutation of the bits may then be mapped to represent a single character. In this manner, each character may be stored, processed, and/or transmitted by a digital device. As used herein, the "length" of a particular fixed-length encoding scheme refers to the number of bits used within that encoding scheme to represent a single character. For example, an 8-bit encoding scheme has a length of 8.

As mentioned, common fixed length encoding schemes include, but are not limited to, the American Standard Code for Information Interchange (ASCII), extended-ASCII, Extended Binary-Coded Decimal Interchange Code (EBCDIC), and Unicode. Each of these encoding schemes will be described in more detail below. However, it will be recognized that fixed length encoding is in no way limited to the encoding schemes described herein.

1. ASCII

ASCII encoding is pervasive in the computing industry and is the data encoding scheme of choice for many computing platforms and network transmissions. In ASCII encoding, groups of seven bits are used to represent 94 printable characters in addition to 34 control characters and other "special characters." Basic ASCII is typically augmented by extended-ASCII, in which an eighth bit is used to facilitate representation of 128 additional symbols. As used herein and in the appended claims, unless otherwise specifically denoted, the term "ASCII" is defined broadly to include extended-ASCII.

2. EBCDIC

EBCDIC is an 8-bit encoding scheme currently used in some types of applications including, but not limited to, various IBM platforms. However, most IBM platforms and other applications that use EBCDIC are configured to convert EBCDIC to ASCII or Unicode when required.

3. Unicode

Unicode is a fixed length encoding scheme that has recently been developed in an effort to replace existing encoding schemes that are limited in size and incompatible with multilingual environments. Unicode encoding includes three major specifications: UTF-8, UTF-16, and UTF-32. UTF stands for Unicode Transformation Format.

UTF-8 is a variable length grouping of 1 through 4 bytes, each encoded in 8 bits. UTF-8 is commonly used in Hypertext Markup Language (HTML) and has the advantage that bit combinations for the standard ASCII characters are represented by the same bit combinations in UTF-8.

UTF-16 encodes commonly used characters in 16 bits. Other characters are also available in UTF-16 encoding by adding a second 16-bit byte. UTF-16 balances storage with efficient access to characters. UTF-32 is a 32-bit encoding scheme that is used to provide a unique single code for each character in a given language or application.

Unicode has been implemented in many recent technologies, including, but not limited to, extensible markup language ("XML"), Java, and modern operating systems.

C. Bit Utilization

As will be described in more detail below, the particular number system used in any fixed length encoding scheme affects the bit utilization of an encoded set of data. As used herein, the term "bit utilization" ("BU") is defined as the ratio of bits containing number system related information divided by total number of bits used by the encoding scheme. For example, if an 8-bit encoding scheme is used to encode a decimal 7 as "00000111", only three of the eight bits contain number system related information. Hence, the bit utilization is 3/8 or 37.5 percent.

The average bit utilization $BU_{ave}$ for data represented by a base B number system and stored using fixed length encoding can be expressed as shown in Equation 4.

$$BU_{ave\,[B,n]} = (i+2-(2^{i+1}/B))/jn \qquad \text{Equation 4}$$

In Equation 4, the variable B represents the base or radix of the number system. The variable i represents the exponent of the highest power of 2 where $2^i \leq B$. The variable n represents the number of bits in one storage container (e.g., if one set or storage container of 8 bits is used to represent a digit, n is equal to 8). The variable j represents the smallest integer such that $2^{jn} \geq B$.

The average bit utilization equation shown in Equation 4 describes the relationship between the base of representation and the bit utilization of the particular encoding scheme that is used to encode a set of data. In general, as the base of representation increases, the average bit utilization also increases. Hence, in some examples, the base of representation of a particular set of data may be converted to a higher base of representation in order to improve the bit utilization of the system used to encode the data.

To illustrate the concept of average bit utilization, Equation 4 will be used to derive the average bit utilization of decimal (base 10) data. In the following illustration, it is assumed that 8-bit encoding is used to encode the data. For decimal data, the parameters for Equation 4 include the following:

The variable B is 10 because the base of representation of decimal data is 10.

The variable i is 3 because 3 is the exponent of the highest power of 2 such that $2^i \leq 10$.

The variable n is 8 because the encoding scheme uses 8 bits to represent each digit within the data.

The variable j is 1 because 1 is the smallest integer such that $2^{jn} \geq 10$.

By inserting the parameters listed above into the average bit utilization equation shown in Equation 4, it can be shown that $BU_{ave[10,8]} = (3+2-2^4/10)/(1*8) = 3.4/8 = 0.425$. Hence, the average bit utilization for decimal data encoded using an 8-bit encoding scheme is 42.5 percent.

The derivation of the average bit utilization for decimal data using 8-bit encoding may be more fully understood by analyzing the actual bits used to encode the digits that are included in a decimal number system. Table 1 illustrates an exemplary 8-bit encoding scheme that may be used to encode each of the digits 0 through 9 that are included in a decimal number system.

TABLE 1

| Digit | Encoding Representation |
|---|---|
| 0 | 00000000 |
| 1 | 00000001 |
| 2 | 00000010 |
| 3 | 00000011 |
| 4 | 00000100 |
| 5 | 00000101 |
| 6 | 00000110 |
| 7 | 00000111 |
| 8 | 00001000 |
| 9 | 00001001 |

For ease of explanation, the bits shown in Table 1 will be interchangeably referred to herein as "bit 0" (right-most bit) through "bit 7" (left-most bit) or as the "first bit" (right-most bit) through the "eighth bit" (left-most bit).

As shown in Table 1, if only bit 0 of an encoded digit is known, the encoded digit could be any one of 5 digits. For example, if it is known that bit 0 is "0", the encoded digit could be 0, 2, 4, 6, or 8. Alternatively, if it is known that bit 0 is "1", the encoded digit could be 1, 3, 5, 7, or 9.

However, if bits 0 and 1 are known, the encoded digit could be one of either 2 or 3 digits. For example, if bits 0 and 1 are both "0", the encoded digit could be 0, 4, or 8.

If bits 0 through 2 are known, it is possible to determine the value of the encoded digit if the three bit sequence is anything other than "000" or "001." This is because digits 0 and 8 end in "000" and digits 1 and 9 end in "001".

Finally, if bits 0 through 3 are known, the value of any encoded digit may be determined because all ten encoding representations have unique bit patterns for bits 0 through 3.

Hence, if the encoded digit is 2, 3, 4, 5, 6, or 7, only three total bits are required to determine the value of the encoded digit. However, if the encoded digit is 0, 1, 8, or 9, all four bits are required to determine the value of the encoded bit. In other words, all of the digits fully utilize the first three bits, while four out of the ten digits utilize the fourth bit. Hence, even though all eight bits are used to represent each digit, only 3+(4/10) of them on average contain number system related information. Therefore, the average bit utilization of a decimal number system encoded with an 8-bit encoding scheme is (3+(4/10))/8=0.425 or 42.5 percent.

To illustrate the effect of a change in base of representation on the average bit utilization of a system used to encode a set of data, the average bit utilization equation shown in Equation 4 will now be used to derive the average bit utilization of base 26 data. For base 26 data, the parameters for Equation 4 include the following:

The variable B is 26 because the base of representation of the data is 26.

The variable i is 4 because 4 is the exponent of the highest power of 2 such that $2^i \leq 26$.

The variable n is 8 because the encoding scheme uses 8 bits to represent each digit within the data.

The variable j is 1 because 1 is the smallest integer such that $2^{jn} \geq 26$.

By inserting the parameters listed above into the average bit utilization equation shown in Equation 4, it can be shown that $BU_{ave[26,8]} = (4+2-2^5/26)/(1*8) \approx 4.7692/8 \approx 0.5962$. Hence, the average bit utilization for base 26 data encoded using an 8-bit encoding scheme is about 59.6 percent.

A useful metric for comparing bit utilization values of two different number systems is given in Equation 5.

$$rBU_{[B1,B2,n1,n2]} = BU_{[B1,n1]}/BU_{[B2,n2]} \quad \text{Equation 5}$$

As shown in Equation 5, the relative bit utilization rBU when converting from base B1 with n1 bit representation to base B2 with n2 bit representation may be calculated by dividing the bit utilization of the first number system (B1) by the bit utilization of the second number system (B2). For example, using the average bit utilization values derived previously for base 10 and for base 26, it can be seen that the base 10 bit utilization is about 71 percent as efficient as the base 26 bit utilization (0.425/0.5962≈0.71).

As mentioned, the formula given in Equation 4 may be used to calculate the average bit utilization of a set of data represented by any base B number system. Formulas may also be derived to calculate best and worst case bit utilization values. For example, Equation 6 shows a formula that may be used to calculate the best case bit utilization $BU_{best}$ and Equation 7 shows a formula that may be used to calculate the worst case bit utilization $BU_{worst}$.

$$BU_{best[B,n]} = (i+1)/jn \quad \text{Equation 6}$$

$$BU_{worst[B,n]} = i/jn \quad \text{Equation 7}$$

The variables used in Equations 6-7 are the same as those used and described in connection with Equation 4. Using Equation 6, it can be shown that the best case bit utilization of 8-bit encoding of base 10 data is 50 percent. Likewise, using Equation 7, it can be shown that the worst case bit utilization of 8-bit encoding of base 10 data is 37.5 percent.

The expected best case, average case, and worst case bit utilization values for 8-bit ASCII encoding are listed in Table 2 for a number of different bases of representation. The bases of representation shown in Table 2 are merely illustrative. The expected best case, average case, and worst case bit utilization values for any other base of representation may be derived using the equations shown above.

TABLE 2

| Base of Number System | Best Case Bit Utilization | Average Case Bit Utilization | Worst Case Bit Utilization |
|---|---|---|---|
| 2 | 0.125 | 0.125 | 0.125 |
| 4 | 0.25 | 0.25 | 0.25 |
| 8 | 0.375 | 0.375 | 0.375 |
| 10 | 0.5 | 0.425 | 0.375 |
| 16 | 0.5 | 0.5 | 0.5 |
| 32 | 0.625 | 0.625 | 0.625 |
| 50 | 0.75 | 0.715 | 0.625 |
| 100 | 0.875 | 0.84 | 0.75 |
| 256 | 1.0 | 1.0 | 1.0 |

As illustrated in Table 2, the expected best case, average case, and worst case bit utilization values for 8-bit ASCII encoding increase as the base of representation of the number system increases.

D. Exemplary Implementations

The systems and methods described herein may be used to improve the bit utilization of any fixed length encoding scheme and may be used in connection with many different types of data processing. For example, the systems and methods described herein may be used to improve bit utilization in data storage, data compression, data manipulation and sorting, infinite length integer representation, and data transmission. It will be recognized that the systems and methods described herein may additionally or alternatively be used to improve bit utilization in any other type of data processing.

For example, the systems and methods described herein may serve to reduce the amount of space needed to store certain types of data in non-volatile storage devices (e.g., local hard drives and network drives). Moreover, the systems and methods described herein may serve to improve overall system performance by reducing the amount of input and output operations between internal memory and such non-volatile storage devices.

To illustrate, typical access times for many non-volatile storage devices can be $10^{-3}$ seconds (milliseconds). However, typical internal memory access times are $10^{-9}$ seconds (nanoseconds) for reading from cache and tens of nanoseconds for reading from dynamic random access memory ("DRAM"). Thus, in many examples, it takes at least 100,000 times as long to access data in a non-volatile storage device as it does to access data in internal memory. Hence, even though additional internal memory access operations may be needed to perform the systems and methods described herein, overall system performance may be enhanced by the reduction in the amount of input and output operations between internal memory and non-volatile storage devices.

II. Exemplary System View

Figure 1:
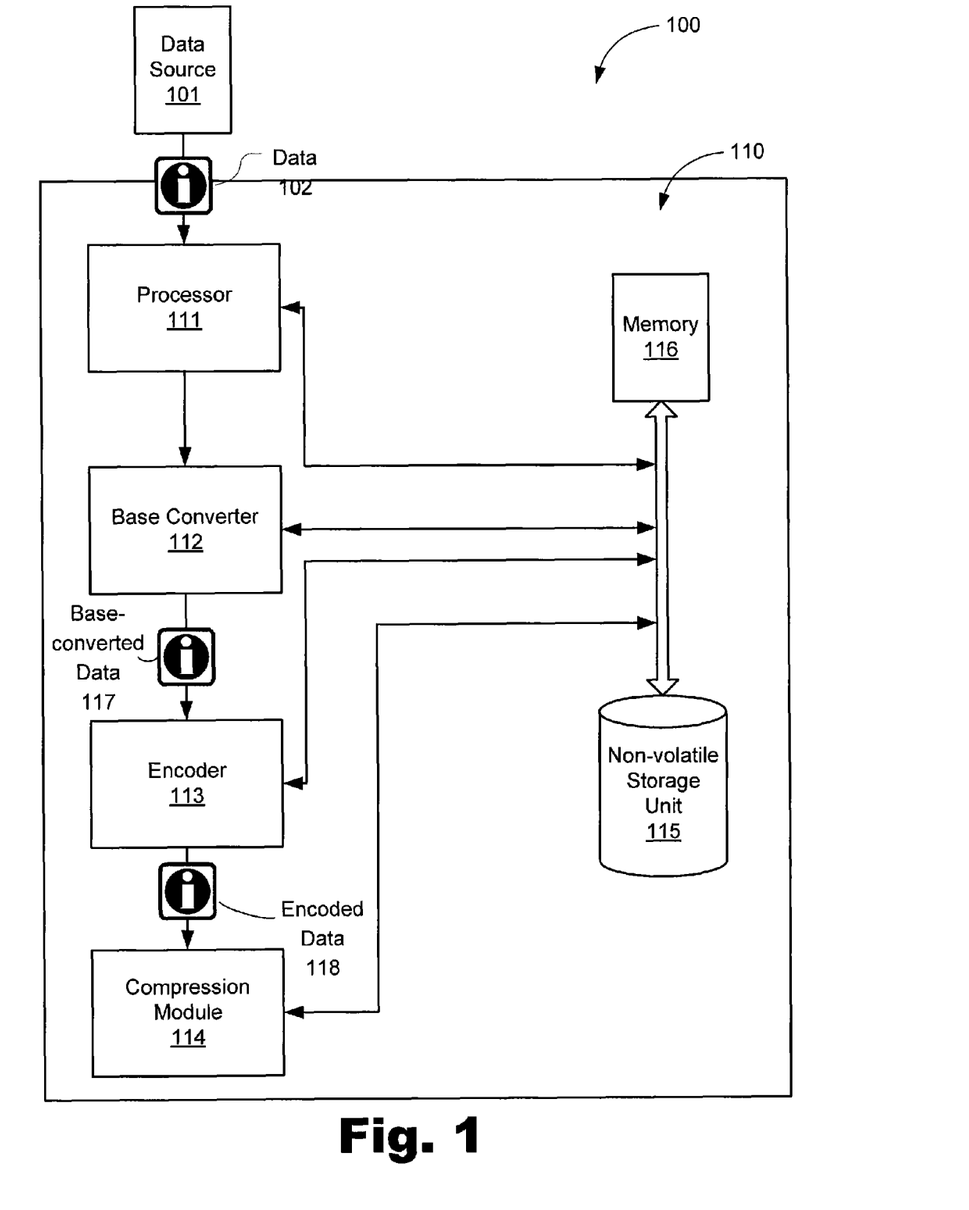
FIG. 1 illustrates an example of an encoding system, according to an embodiment.

FIG. 1 illustrates an exemplary encoding system 100 (or simply "system 100"), according to one embodiment. As shown in FIG. 1, a data source 101 is configured to provide data 102 to a data processing subsystem 110. Data source 101 and data processing subsystem 110 may communicate using any known communication technologies, devices, media, and protocols supportive of data communications, including, but not limited to, coaxial cables, copper wires, fiber optics, data buses, the Internet, intranets, local area networks, other communications networks, data transmission media, communications devices, Transmission Control Protocol ("TCP"), Internet Protocol ("IP"), File Transfer Protocol ("FTP"), telnet, Hypertext Transfer Protocol ("HTTP"), socket connections, Ethernet, and other suitable communications technologies.

It has been discovered that overall bit utilization of the encoding system 100 increases as the base of representation of the data being encoded by the data processing subsystem 110 increases. Hence, in certain embodiments, the data processing subsystem 110 is configured to optimize bit utilization by converting the data 102 to a higher base of representation before the data is encoded. In this manner, the number of digits that are encoded by the data processing subsystem 110 is decreased, thereby decreasing the total number of bits that have to be used to encode the data 102.

While an exemplary encoding system 100 is shown in FIG. 1, the exemplary components illustrated in FIG. 1 are not intended to be limiting. Indeed, alternative combinations of hardware, software, and/or firmware and implementations thereof may be used, as is well known. Each of the components of system 100 will now be described in additional detail.

A. Data Source

Data source 101 may include any device, program, or function configured to generate, store, and/or communicate data 102 to the data processing subsystem 110. For example, data source 101 may include a hard drive or database configured to store data 102.

B. Data

Data 102 may include any combination of characters such as, but not limited to, letters, numbers, and symbols. For example, the data 102 may include text in any language, compilations of numbers (e.g., telephone numbers, social security numbers, etc.), or any other combination of characters. Exemplary sets of data 102 that will be used to illustrate the systems and methods described herein include a database of telephone numbers and a file containing the text of the King James version of the Bible. In some examples, the data 102 is included within a computer readable file, such as a text file.

As used herein, the term "set of data" or "data set" will be used interchangeably to refer to a designated group of characters that may be encoded.

D. Data Processing Subsystem

Data processing subsystem 110 may include any component or combination of components configured to process the data 102 provided by the data source 101. For example, as shown in FIG. 1, the data processing subsystem 110 may include a processor 111, base converter 112, encoder 113, compression module 114, non-volatile storage unit 115, and/or memory 116.

In many embodiments, the data processing subsystem 110 is implemented in one or more computers. The data processing subsystem 110 may include any computer hardware and/or instructions (e.g., software programs), or combinations of software and hardware, configured to perform the processes described herein. In particular, it should be understood that data processing subsystem 110 may be implemented on one physical computing device or may be implemented on more than one physical computing device. Accordingly, data processing subsystem 110 may include any one of a number of well-known computing devices, and may employ any of a number of well-known computer operating systems, including, but by no means limited to, known versions and/or varieties of the Microsoft Windows® operating system, the Unix operating system, the Macintosh® operating system, and the Linux operating system.

Accordingly, the various processes described herein may be implemented at least in part as instructions executable by one or more computing devices, as is well known. In general, a processor (e.g., a microprocessor) receives instructions, e.g., from a memory, a computer-readable medium, etc., and executes those instructions, thereby performing one or more processes, including one or more of the processes described herein. Such instructions may be stored and transmitted using a variety of known computer-readable media.

A computer-readable medium (also referred to as a processor-readable medium) includes any medium that participates in providing data (e.g., instructions) that may be read by a computer (e.g., by a processor of a computer). Such a medium may take many forms, including, but not limited to, non-volatile media, volatile media, and transmission media. Non-volatile media may include, for example, optical or magnetic disks and other persistent memory. Volatile media may include, for example, dynamic random access memory ("DRAM"), which typically constitutes a main memory. Transmission media may include, for example, coaxial cables, copper wire and fiber optics, including the wires that comprise a system bus coupled to a processor of a computer.

Transmission media may include or convey acoustic waves, light waves, and electromagnetic emissions, such as those generated during radio frequency ("RF") and infrared ("IR") data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

While an exemplary data processing subsystem 110 is shown in FIG. 1, the exemplary components illustrated in FIG. 1 are not intended to be limiting. Indeed, additional or alternative components and/or implementations may be used, as is well known. Various components of the data processing subsystem 110 will now be described in additional detail.

1. Processor

As shown in FIG. 1, the processor 111 is configured to receive and process data 102 from the data source 101. The processor 111 may include any combination of hardware, software, and firmware as may serve a particular application. For example, the processor 111 may include a central processing unit (CPU), application specific integrated circuit (ASIC), field programmable gate array (FPGA), or any other type of processing circuit.

In some embodiments, the processor 111 is configured to parse the data 102 and find and count unique characters contained therein. For example, if the data 102 were to include a compilation of telephone numbers, the processor 111 may find up to 10 unique characters (0-9) contained therein. Likewise, if the data 102 were to include text from, for example, the King James version of the Bible, the processor 111 would find 87 unique characters contained therein.

In some examples, the processor 111 may be further configured to store each of the unique characters within a digit list file that may be located within either the memory 116 or non-volatile storage unit 115. It will be recognized that the digit list file may additionally or alternatively be located in any other storage medium as may serve a particular application. The digit list file, as will be described in more detail below, includes a listing of all the unique characters as identified by the processor 111 within a set of data 102.

2. Base Converter

Base converter 112 is configured to convert a set of data 102 from a first base of representation to a second higher base of representation. The converted data is represented in FIG. 1 by base-converted data 117. For example, if the data 102 were to include a compilation of decimal digits (e.g., telephone numbers), the base converter 112 may be configured to convert the data 102 into data represented by a higher base number system (e.g., a base 100 number system).

The base converter 112 may include any combination of hardware, software, and/or firmware as may serve a particular application. For example, the base converter 112 may include any type of processor, program, and/or combination thereof. In some examples, the base converter 112 uses one or more look-up tables and/or is configured to perform one or more mathematical operations in order to convert the data 102 from one base of representation to another.

In certain embodiments, the base converter 112 may additionally be configured to convert the base-converted data 117 back into data 102 represented by the first base. In this manner, the data 102 may be accessed at a later time by a user of the data processing subsystem 110.

3. Encoder

Encoder 113 may be configured to encode the base-converted data 117 and output encoded data 118. In some examples, the encoder 113 may perform any type of fixed length encoding as may serve a particular application. For example, the encoder 113 may be configured to encode the base-converted data 117 using ASCII, EBCDIC, and/or Unicode. Moreover, the encoder 113 may include any combination of hardware, software, and/or firmware as may serve a particular application.

The number of bits used in the fixed length encoding may vary as may serve a particular application. For illustrative purposes only, it will be assumed in the examples given herein that 8-bit encoding is used by the encoder 113 to encode the base-converted data 117.

4. Compression Module

In some examples, the data processing subsystem 110 may include a compression module 114 configured to compress the encoded data 118. Compression is desirable in applications such as data transmission and storage. However, it will be recognized that, in some applications, it is not desirable to compress the encoded data 118.

The compression module 114 may include any combination of hardware, software, and/or firmware as may serve a particular application. For example, the compression module 115 may include a known compression utility such as, but not limited to, "zip," "compress," "pack," "gzip," and "bzip2." However, it will be recognized that the compression module 114 may additionally or alternatively include any other type of compression utility.

5. Non-Volatile Storage Unit

Non-volatile storage unit 115 may include one or more data storage mediums, devices, or configurations and may employ any type, form, and combination of storage media including, but not limited to, hard disk drives, read-only memory, databases, and optical media. Non-volatile storage unit 115 may include any known technologies useful for storing, updating, modifying, accessing, retrieving, and deleting data.

6. Memory

The data processing subsystem 110 may also include memory 116. Memory 116 may include, but is not limited to, FLASH memory, random access memory (RAM), dynamic RAM (DRAM), one or more buffers, or a combination thereof. The memory 116 may facilitate the temporary storage and/or manipulation of data 102.

7. Additional Components

Figure 2:
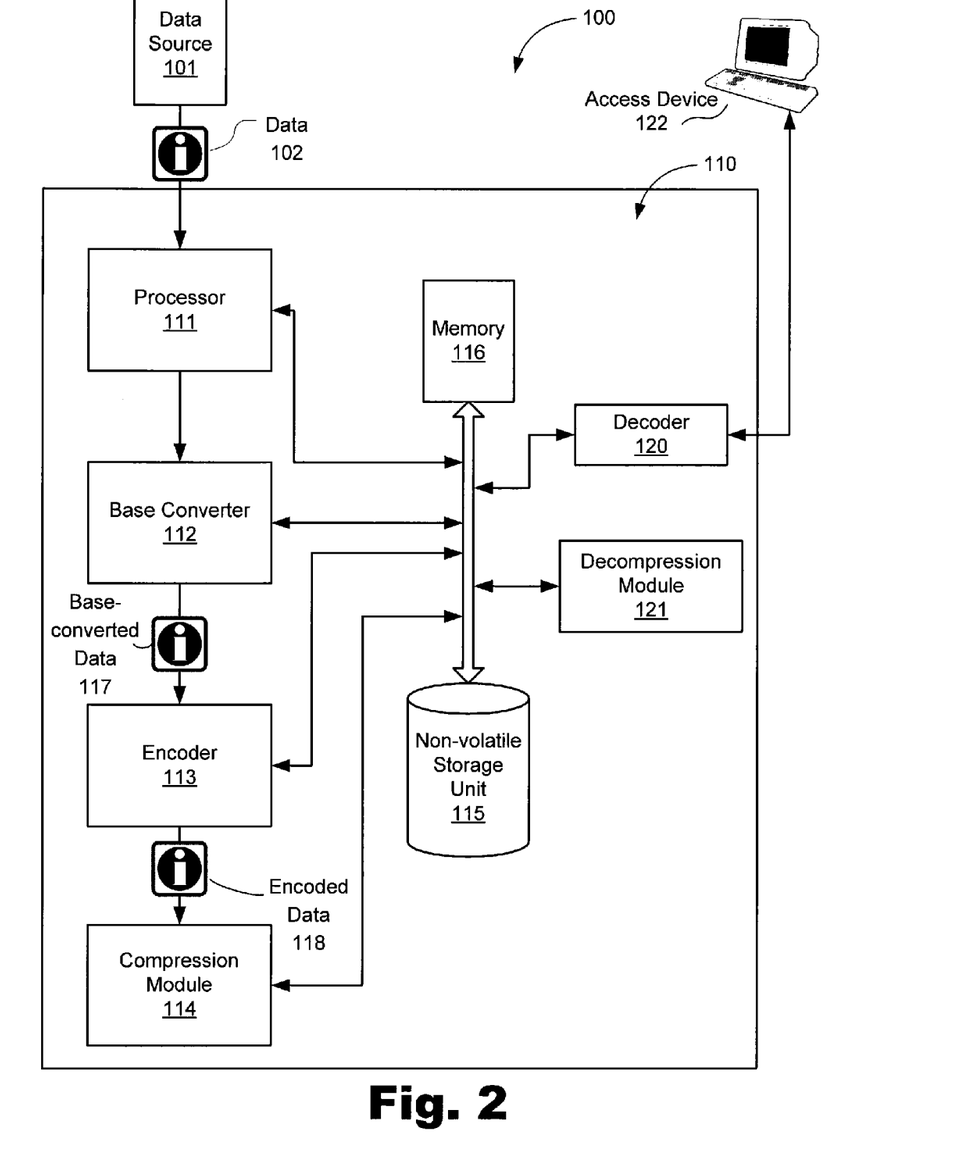
FIG. 2 illustrates an example of an encoding system further configured to decode encoded data, according to an embodiment.

In certain embodiments, the data processing subsystem 110 may include any of a number of additional or alternative components. For example, as shown in FIG. 2, the data processing subsystem 110 may include a decoder 120 configured to decode the encoded data 118. The decoder 120 may be configured to convert the encoded data 118 from machine-readable bits back to the base-converted data 117. The base converter 112 may then convert the base-converted data 117 into the original data 102. In addition, the data processing subsystem 110 may include a decompression module 121 configured to decompress data that has been compressed by the compression module 114.

In some examples, one or more access devices 122 may be configured to communicate with the data processing subsystem 110. The access device 122 may include any of a number of different types of devices such as, but not limited to, a personal computer, a handheld device (e.g., a personal digital assistant ("PDA") or a cellular telephone), or any other type of computing device. In some examples, a user may access the data 102 via the access device 122.

E. Digit List File

As mentioned, the processor 111 may be configured to locate and store each of the unique characters within a set of data 102 in a digit list file. The digit list file may be stored in the non-volatile storage unit 115, memory 116, or in any other suitable location.

Figure 3:
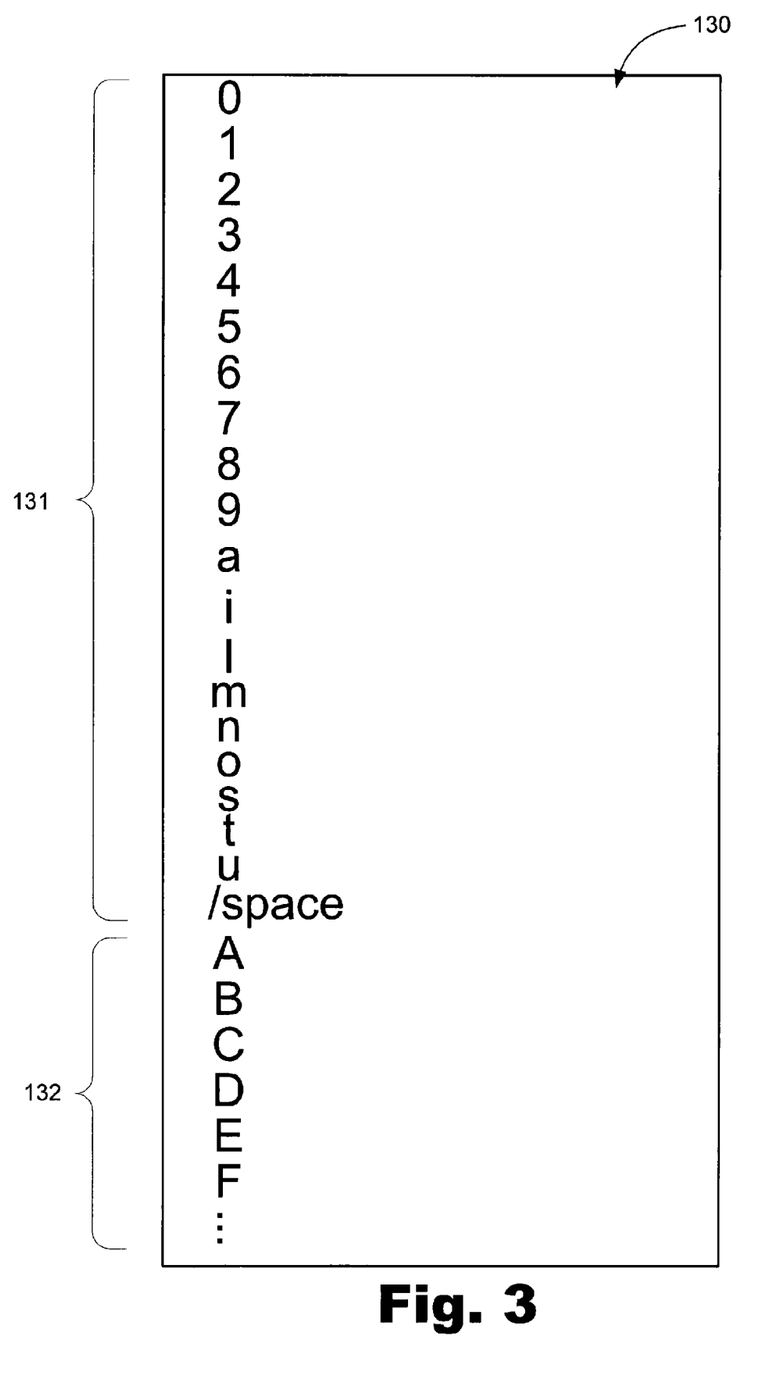
FIG. 3 illustrates the contents of an exemplary digit list file corresponding to a particular set of data, according to an embodiment.

FIG. 3 illustrates the contents of an exemplary digit list file 130 corresponding to a particular set of data that includes the following phrase: "67980 minus 21345 is a lot". As shown in FIG. 3, the digit list file 130 includes a listing of all of the unique characters 131 contained within the set of data. In the particular example of FIG. 3, there are 20 unique characters 131, including the "space" character. In some examples, as shown in FIG. 3, the characters 131 within the digit list 130 may be arranged in a particular order, e.g., in ascending numerical and then alphabetical order. The characters 131 are shown to be on separate lines for illustrative purposes only. It will be recognized that the characters 131 may alternatively be separated using any type of separator (e.g., whitespaces or commas) or listed without any type of separator.

In some examples, the digit list file 130 may also list a number of additional characters not found within the set of data 102. For example, the digit list file 130 shown in FIG. 3 may include the additional characters A, B, C, D, E, and F, collectively labeled as 132.

In certain embodiments, the additional characters 132 are sequentially listed after the unique characters 131 are listed within the digit list file 130. As will be described in more detail below, the additional characters 132 may be used by the base converter 112 to convert the data 102 into a higher base of representation.

In certain embodiments, the number of unique characters contained within a set of data 102 is considered to be the original base of representation of that set of data 102. For example, the data set corresponding to the digit list 130 of FIG. 3 has an original base of representation equal to 20 because there are 20 unique characters contained therein. Each unique character 131 within the digit list 130 corresponds to a digit position within a number system having the original base of representation. For example, in the example of FIG. 3, the character "0" corresponds to the first position with a base 20 number system, "1" corresponds to the second position with the base 20 number system, and so on through the "space" character, which corresponds to the last or twentieth position within the base 20 number system. In addition, each of the additional characters 132 corresponds to a digit position within one or more higher bases of representation to which the data 102 may be converted.

Once the digit list 130 is created, the digit list 130 may then be used by the base converter 112 to convert the set of data 102 into a set of data having a higher base of representation. Any known algorithm for converting from one base of representation to another may be used by the base converter 112. For example, the exemplary data set of "67980 minus 21345 is a lot" in base 20 may be converted into a set of data having any base of representation that is higher than base 20. It will be recognized that the base-converted data 102 may use one or more of the additional characters 132 within the digit list 130 to represent the data 102 at the higher base of representation.

Once the base converter 112 converts the base of representation of the set of data 102 into a higher base of representation, the encoder 113 may encode the base-converted data 117 using any suitable fixed length encoding scheme. For example, the encoder 113 may use an 8-bit ASCII encoding scheme to encode the base-converted data 117.

The encoded data 118 may then be compressed, stored, transferred, or otherwise processed by the data processing subsystem 110. For example, the encoded data 118 may be compressed by compression module 114.

If a user of an access device 122 desires to access the original data 102, the data processing subsystem 110 may be configured to decode the encoded data 118 and convert the data back into the original base of representation. In some examples, the base converter 112 uses the information contained within the digit list file 130 to perform the base conversion.

III. Exemplary Process View

Figure 4:
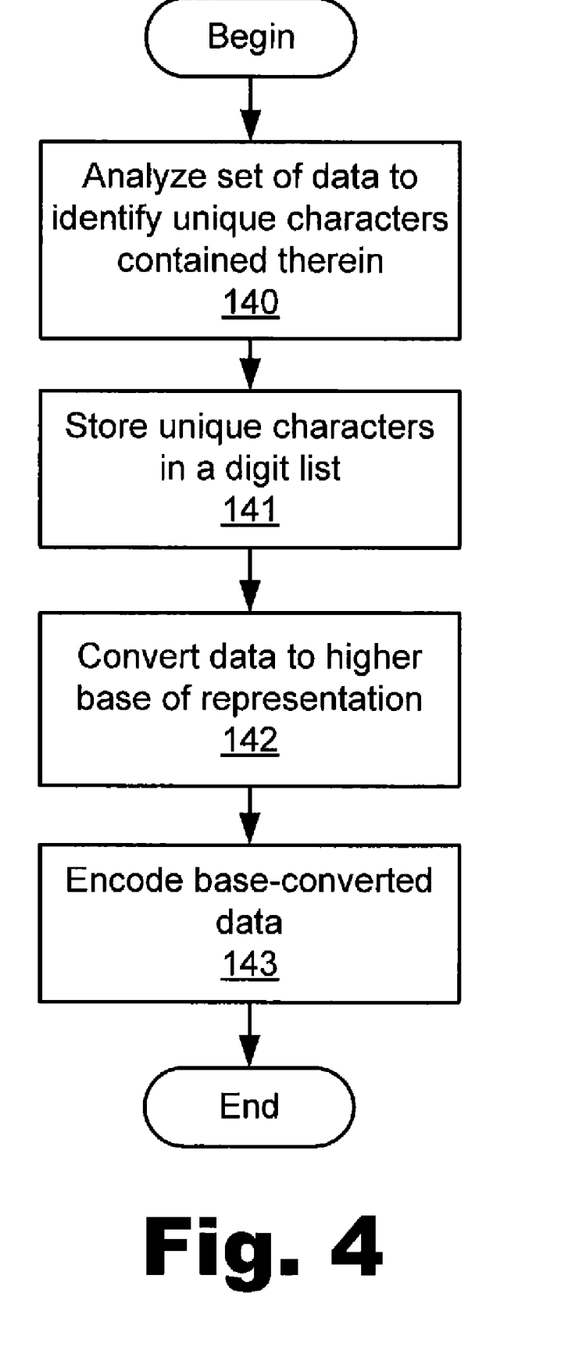
FIG. 4 illustrates an exemplary method of encoding a set of data in a fixed length encoding scheme, according to an embodiment.

FIG. 4 illustrates an exemplary method of encoding a set of data in a fixed length encoding scheme, according to an embodiment. While FIG. 4 illustrates exemplary steps according to one embodiment, other embodiments may omit, add to, reorder, and/or modify any of the steps shown in FIG. 4.

In step 140, a set of data 102 is analyzed to identify all of the unique characters contained therein. In some examples, the data processing subsystem 110 is configured to perform the analysis. The number of unique characters contained within the set of data 102 is considered to be the original base of representation of the set of data 102.

The unique characters are then stored in a digit list, as shown in step 141. The digit list may be included within a digit list file, such as digit list file 130.

In step 142, the data 102 is converted to a higher base of representation. In certain embodiments, the base converter 112 uses the information contained within the digit list to perform the base conversion.

The higher base of representation may be any base of representation that is higher than the original base of representation of the data 102. For example, if the data 102 is decimal data (i.e., r=10), the base converter 112 may be configured to convert the base of representation of the data 102 to any base that is greater than or equal to 11.

However, the gains in bit utilization that are accomplished at some higher bases of representation may be offset by the extra data processing required to perform the base conversion. Hence, in certain embodiments, the higher base of representation may be chosen to optimize the bit utilization while minimizing the data processing required to perform the base conversion. For example, the data 102 may be converted into a base of representation that is the maximum power of the original base of representation permitted by the length of the particular encoding scheme. By converting the data 102 into a base of representation that is a power of the original base, the data processing required to convert the data 102 into the higher base is minimized because simple look up tables may be used to perform the base conversion.

To illustrate, in an 8-bit encoding scheme, the maximum base size permitted by the 8 bit encoding length is 256 (because $2^8$ is equal to 256). Hence, if the data 102 is decimal data (i.e., r=10), the base converter 112 may be configured to convert the base of representation of the data 102 to 100 because 100 is the highest power of 10 that is less than 256. However, it will be recognized that that original base of representation of the data 102 may be converted to any higher base of representation as may serve a particular application.

In step 143, the base-converted data 117 is encoded using any suitable fixed length encoding scheme. For example, an 8-bit ASCII encoding scheme may be used to encode the base-converted data 117. The encoded data may then be compressed, stored, transferred, or otherwise processed by the data processing subsystem 110.

Figure 5:
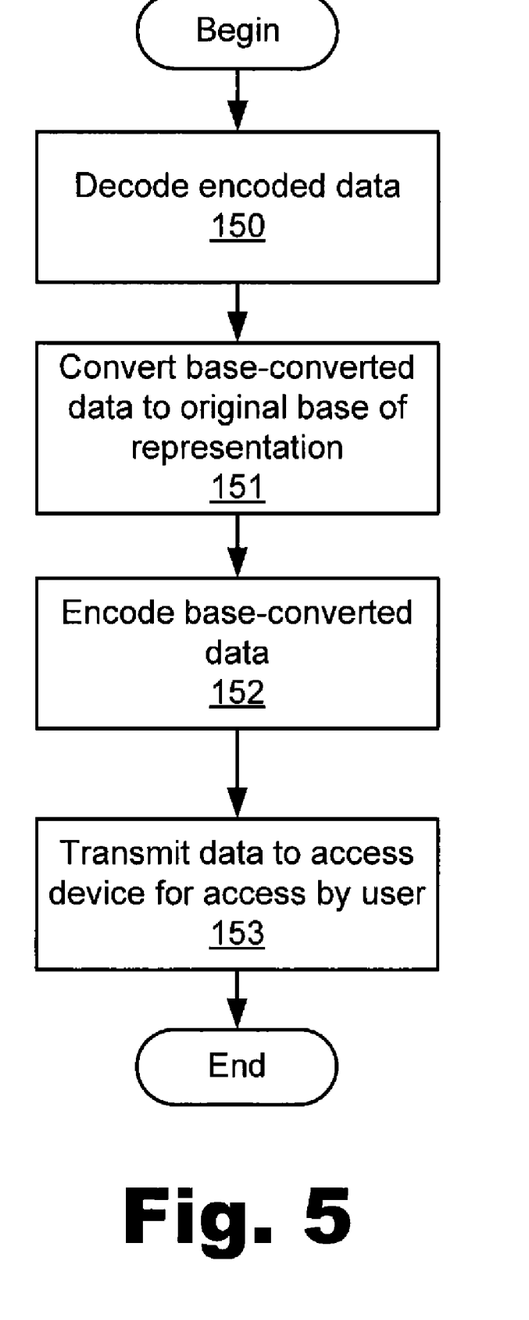
FIG. 5 illustrates an exemplary method of decoding data that has been base-converted and encoded, according to an embodiment.

FIG. 5 illustrates an exemplary method of decoding data that has been base-converted and encoded, according to an embodiment. While FIG. 5 illustrates exemplary steps according to one embodiment, other embodiments may omit, add to, reorder, and/or modify any of the steps shown in FIG. 5.

In step 150, the encoded data 118 is decoded. Any suitable decoder 120 may be configured to decode the encoded data 118.

The base of representation of the base-converted data is then converted to the original base of representation of the data 102, as shown in step 151. For example, if the base-converted data 117 is represented in base 100 and the original base of representation of the data 102 is 10, the base-converted data 117 may be converted to base 10. In some examples, the digit list created during the encoding of the data 102 is used to convert the base-converted data 117 back into the original base of representation. The base-converted data 117 may then be encoded, as shown in step 152, and transmitted to an access device 122 so that a user may access the decoded data 102, as shown in step 153.

IV. Examples

To facilitate an understanding of the systems and methods described herein, a number of examples of optimizing bit utilization within a fixed length encoding scheme will now be given.

A. Exemplary Source Code

Exemplary source code that may be used to perform base conversion and bit utilization calculations in connection with the following examples is given in Appendix I. The source code of Appendix I is written in ML, a modern functional language. However, it will be recognized that the code may alternatively be written in any other suitable programming language.

The base conversion function in the source code is called B2B and accepts a numeral in string format, a first base of representation value, a second base of representation value, and a boolean value which specifies whether or not to preserve leading zeros. The base conversion function returns a numeral in string format that represents the input numeral converted to the second base of representation. A sample run of the B2B function which illustrates conversion from base 10 to base 16 with preservation of leading zeros is given below:

```
B2B("015",10,16,true);
val it = "0F" : string
```

The exemplary code also includes four bit utilization calculations called BU, rBU, rangeBU and rangeRBU. BU expects three parameters: a base of representation value, the number of bits in the fixed length encoding scheme, and one of the following strings: "best", "worst" or "avg". BU returns the bit utilization of a particular base of representation and encoding length pair. For example, a sample execution of the BU function for base 10 with 8-bit encoding is given below:

```
BU(10,8,"avg");
val it = 0.425 : real
```

The function rBU returns the expected factor of bit utilization change associated with a conversion between a first and second base of representation. The function expects five parameters: the first base of representation, the second base of representation, the length of the encoding scheme associated with the first base of representation, the length of the encoding scheme associated with the second base of representation, and one of the following strings: "best", "worst" or "avg". The following sample rBU execution shows the average case bit utilization change when data is converted from base 10 to base 26, each with 8-bit encoding:

```
rBU(10,26,8,8,"avg");
val it = 0.712903225806 : real
```

The function rangeBU accepts a base value and the number of bits of an encoding scheme and returns best, average, and worst case bit utilization values. The following rangeBU execution shows the best, average, and worst case bit utilization values for the bases 10 and 26, each with 8-bit encoding:

```
rangeBU(10,8);
val it = (0.5,0.425,0.375) : real*real*real
rangeBU(26,8);
val it = (0.625,0.596153846154,0.5) : real*real*real
```

Similarly, the function rangeRBU accepts a first base of representation, a second base of representation, a length of the encoding scheme associated with the first base of representation, and a length of the encoding scheme associated with the second base of representation. The function rangeRBU returns best, average, and worst case relative bit utilization values between the first and second bases of representation. The following rangeRBU execution shows the relative best, average, and worst case bit utilization values between base 10 and base 26:

```
rangeRBU(10,26,8,8);
val it = (0.6,0.712903225806,1.0) : real*real*real
```

B. First Example

In a first example, a data file comprising 32,634,193 decimal telephone numbers was encoded using an 8-bit encoding scheme. Each telephone number included 10 characters or digits. Each telephone number occupied its own line within the data file.

The data file was first analyzed by the data processing subsystem 110. Because the data file included only telephone numbers, 10 unique characters (the numerals 0-9) were found by the data processing system 110. Hence, the data was considered to be base 10 data. For comparative purposes, the newline characters within the data file were ignored.

A digit list file named "AlphaBet.sml" was then created, the contents of which are shown in Appendix II. As shown in Appendix II, the first ten digits listed correspond to the ten unique characters found within the data file. A number of additional digits are also included within the digit list file. These additional digits include a number of ASCII symbols and were used to convert the data file to a higher base of representation.

A number of trials were then run wherein the base of representation of the data file was converted to each of a number of different bases of representation ranging from base 2 to base 245. Each time, the base-converted data was encoded using 8-bit encoding. The size of the resultant data file was then measured by calculating the full file size and subtracting one byte per line for the newline characters. Table 3 shows a select number of resultant data file sizes:

TABLE 3

| Base of Data File | Size in Megabytes |
| --- | --- |
| 10 | 311.22 |
| 62 | 186.81 |
| 93 | 167.39 |
| 100 | 155.61 |

As shown in Table 3, data having the initial base 10 data consumed 311.22 megabytes of disk space. However, after the data file had been converted to base 62 and encoded, the resultant data file only consumed 186.81 megabytes. Likewise, the data in base 93 consumed 167.39 megabytes and the data in base 100 consumed 155.61 megabytes. The complete results of the trials are shown in Appendix III.

Hence, as shown in Appendix III, conversion of base 10 data to a higher base of representation resulted in substantial bit utilization optimization. For example, by converting the base 10 data to base 100 data, the resultant data file was approximately half the size as the original data file.

C. Second Example

In another example, a data file comprising the entire text from the King James version of the Bible was encoded using an 8-bit encoding scheme. The data within the file was first analyzed by the data processing subsystem 110 and found to contain 87 unique characters. Hence, the data was considered to be base eighty-seven data.

A digit list file named "bible_alphabet.sml" was then created, the contents of which are shown in Appendix IV. The first 87 characters listed within the digit list file correspond to the 87 unique characters found within the data file. A number of additional digits are also included within the digit list file. These additional digits include a number of ASCII symbols and were used to convert the data file to a higher base of representation.

A number of trials were then run wherein the base of representation of the data file was converted to each of a number of different bases of representation ranging from base 2 to base 247. Each time, the base-converted data was encoded using 8-bit encoding. The size of the resultant data file was then calculated. Table 4 shows a select number of resultant data file sizes:

TABLE 4

| Base of Data File | Size in Megabytes |
| --- | --- |
| 87 | 3.49 |
| 150 | 3.40 |
| 200 | 3.28 |
| 247 | 3.16 |

As shown in Table 4, data having the initial base eighty-seven consumed 3.49 megabytes of disk space. However, after the data file had been converted to base 150 and encoded, the resultant data file consumed 3.40 megabytes. Likewise, the data in base 200 consumed 3.28 megabytes and the data in base 247 consumed 3.16 megabytes. The complete results of the trials are shown in Appendix V.

V. Alternative Embodiments

The preceding description has been presented only to illustrate and describe embodiments of the invention. It is not intended to be exhaustive or to limit the invention to any precise form disclosed. The invention may be practiced otherwise than is specifically explained and illustrated without departing from its spirit or scope. It is intended that the scope of the invention be defined by the following claims.

APPENDIX II

```
(*
 * File name - AlphaBet.sml
 * The digits in this Alphabet are chosen to match RFC 1924
 *         (http://www.faqs.org/rfcs/rfc1924.html)
 * for bases from 2 through 85.
 *)
val AlphaBet=
(
    "0123456789"   (* 0 -> 9 *) (*ASCII: 48-57*)
(*  1         2         3
 *  0123456789012345678901234 5 *)
    "ABCDEFGHIJKLMNOPQRSTUVWXYZ"^ (*ASCII: 65-90*)
(*  3    4         5         6
 *  67890123456789012345678901 *)
    "abcdefghijklmnopqrstuvwxyz"^ (*ASCII: 97-122*)
    "!"^                           (*62 / ASC 33 *)
    "#"^                           (*63 / ASC 35 *)
    "$"^                           (*64 / ASC 36 *)
    "%"^                           (*65 / ASC 37 *)
    "&"^                           (*66 / ASC 38 *)
    "("^                           (*67 / ASC 40 *)
    ")"^                           (*68 / ASC 41 *)
    "*"^                           (*69 / ASC 42 *)
    "+"^                           (*70 / ASC 43 *)
    "-"^                           (*71 / ASC 44 *)
    ";"^                           (*72 / ASC 45 *)
    "<"^                           (*73 / ASC 60 *)
    "="^                           (*74 / ASC 61 *)
    ">"^                           (*75 / ASC 62 *)
    "?"^                           (*76 / ASC 63 *)
    "@"^                           (*77 / ASC 64 *)
    "^"^                           (*78 / ASC 94 *)
    "_"^                           (*79 / ASC 95 *)
    "`"^                           (*80 / ASC 96 *)
    "{"^                           (*81 / ASC 123 *)
    "|"^                           (*82 / ASC 124 *)
    "}"^                           (*83 / ASC 125 *)
    "~"^                           (*84 / ASC 126 *)
    ":"^                           (*85 / ASC 58 *)
    ","^                           (*86 / ASC 44 *)
    "."^                           (*87 / ASC 46 *)
    "/"^                           (*88 / ASC 47 *)
    "["^                           (*89 / ASC 91 *)
    "]"^                           (*90 / ASC 93 *)
    "\""^                          (*91 / ASC 34 *)
    "'"^                           (*92 / ASC 39 *)
    "\\"^                          (*93 / ASC 92 *)
```

APPENDIX II-continued (* For number systems using the digits,
* from here on, I/O becomes more complicated
*)
(* Extended ASCII & " " *)

| | |
|---|---|
| "\128" ^ | (*94*) |
| "\129" ^ | (*95*) |
| "\130" ^ | (*96*) |
| "\131" ^ | (*97*) |
| "\132" ^ | (*98*) |
| "\133" ^ | (*99*) |
| "\134" ^ | (*100*) |
| "\135" ^ | (*101*) |
| "\136" ^ | (*102*) |
| "\137" ^ | (*103*) |
| "\138" ^ | (*104*) |
| "\139" ^ | (*105*) |
| "\140" ^ | (*106*) |
| "\141" ^ | (*107*) |
| "\142" ^ | (*108*) |
| "\143" ^ | (*109*) |
| "\144" ^ | (*110*) |
| "\145" ^ | (*111*) |
| "\146" ^ | (*112*) |
| "\147" ^ | (*113*) |
| "\148" ^ | (*114*) |
| "\149" ^ | (*115*) |
| "\150" ^ | (*116*) |
| "\151" ^ | (*117*) |
| "\152" ^ | (*118*) |
| "\153" ^ | (*119*) |
| "\154" ^ | (*120*) |
| "\155" ^ | (*121*) |
| "\156" ^ | (*122*) |
| "\157" ^ | (*123*) |
| "\158" ^ | (*124*) |
| "\159" ^ | (*125*) |
| "\160" ^ | (*126*) |
| "\161" ^ | (*127*) |
| "\162" ^ | (*128*) |
| "\163" ^ | (*129*) |
| "\164" ^ | (*130*) |
| "\165" ^ | (*131*) |
| "\166" ^ | (*132*) |
| "\167" ^ | (*133*) |
| "\168" ^ | (*134*) |
| "\169" ^ | (*135*) |
| "\170" ^ | (*136*) |
| "\171" ^ | (*137*) |
| "\172" ^ | (*138*) |
| "\173" ^ | (*139*) |
| "\174" ^ | (*140*) |
| "\175" ^ | (*141*) |
| "\176" ^ | (*142*) |
| "\177" ^ | (*143*) |
| "\178" ^ | (*144*) |
| "\179" ^ | (*145*) |
| "\180" ^ | (*146*) |
| "\181" ^ | (*147*) |
| "\182" ^ | (*148*) |
| "\183" ^ | (*149*) |
| "\184" ^ | (*150*) |
| "\185" ^ | (*151*) |
| "\186" ^ | (*152*) |
| "\187" ^ | (*153*) |
| "\188" ^ | (*154*) |
| "\189" ^ | (*155*) |
| "\190" ^ | (*156*) |
| "\191" ^ | (*157*) |
| "\192" ^ | (*158*) |
| "\193" ^ | (*159*) |
| "\194" ^ | (*160*) |
| "\195" ^ | (*161*) |
| "\196" ^ | (*162*) |
| "\197" ^ | (*163*) |
| "\198" ^ | (*164*) |
| "\199" ^ | (*165*) |
| "\200" ^ | (*166*) |
| "\201" ^ | (*167*) |
| "\202" ^ | (*168*) |
| "\203" ^ | (*169*) |
| "\204" ^ | (*170*) |
| "\205" ^ | (*171*) |
| "\206" ^ | (*172*) |
| "\207" ^ | (*173*) |
| "\208" ^ | (*174*) |
| "\209" ^ | (*175*) |
| "\210" ^ | (*176*) |
| "\211" ^ | (*177*) |
| "\212" ^ | (*178*) |
| "\213" ^ | (*179*) |
| "\214" ^ | (*180*) |
| "\215" ^ | (*181*) |
| "\216" ^ | (*182*) |
| "\217" ^ | (*183*) |
| "\218" ^ | (*184*) |
| "\219" ^ | (*185*) |
| "\220" ^ | (*186*) |
| "\221" ^ | (*187*) |
| "\222" ^ | (*188*) |
| "\223" ^ | (*189*) |
| "\224" ^ | (*190*) |
| "\225" ^ | (*191*) |
| "\226" ^ | (*192*) |
| "\227" ^ | (*193*) |
| "\228" ^ | (*194*) |
| "\229" ^ | (*195*) |
| "\230" ^ | (*196*) |
| "\231" ^ | (*197*) |
| "\232" ^ | (*198*) |
| "\233" ^ | (*199*) |
| "\234" ^ | (*200*) |
| "\235" ^ | (*201*) |
| "\236" ^ | (*202*) |
| "\237" ^ | (*203*) |
| "\238" ^ | (*204*) |
| "\239" ^ | (*205*) |
| "\240" ^ | (*206*) |
| "\241" ^ | (*207*) |
| "\242" ^ | (*208*) |
| "\243" ^ | (*209*) |
| "\244" ^ | (*210*) |
| "\245" ^ | (*211*) |
| "\246" ^ | (*212*) |
| "\247" ^ | (*213*) |
| "\248" ^ | (*214*) |
| "\249" ^ | (*215*) |
| "\250" ^ | (*216*) |
| "\251" ^ | (*217*) |
| "\252" ^ | (*218*) |
| "\253" ^ | (*219*) |
| "\254" ^ | (*220*) |
| "\255" ^ | (*247*) |

(* Other non-printable characers from basic ASCII *)

| | |
|---|---|
| "\001" ^ | (*221*) |
| "\002" ^ | (*222*) |
| "\003" ^ | (*223*) |
| "\004" ^ | (*224*) |
| "\005" ^ | (*225*) |
| "\006" ^ | (*226*) |
| "\007" ^ | (*227*) |
| "\008" ^ | (*228*) |
| "\014" ^ | (*229*) |
| "\015" ^ | (*230*) |
| "\016" ^ | (*231*) |
| "\017" ^ | (*232*) |
| "\018" ^ | (*233*) |
| "\019" ^ | (*234*) |
| "\020" ^ | (*235*) |
| "\021" ^ | (*236*) |
| "\022" ^ | (*237*) |
| "\023" ^ | (*238*) |
| "\024" ^ | (*239*) |
| "\025" ^ | (*240*) |
| "\026" ^ | (*241*) |
| "\027" ^ | (*242*) |
| "\028" ^ | (*243*) |
| "\029" ^ | (*244*) |
| "\030" ^ | (*245*) |
| "\031" ^ | (*246*) |

APPENDIX II-continued

```
" "       (*[SPACE / ASC 32] *)   (*248*)
"\127" ^                          (*249*)
"\012" ^   [FF]                   (*250*)
"\009" ^   [TAB]                  (*251*)
"\010" ^   [NL]                   (*252*)
"\011" ^                          (*253*)
"\013" ^   [CR]                   (*254*)
"\000"                            (*255*)
*)
);
```

APPENDIX III

| Base of Data File | Size in Bytes |
| --- | --- |
| 2 | 1,063,468,262 |
| 3 | 676,684,671 |
| 4 | 542,086,267 |
| 5 | 471,473,922 |
| 7 | 391,680,665 |
| 8 | 361,712,665 |
| 10 | 326,341,930 |
| 12 | 312,465,742 |
| 13 | 293,707,737 |
| 15 | 288,840,417 |
| 17 | 273,412,321 |
| 18 | 261,073,544 |
| 20 | 261,073,544 |
| 22 | 256,281,086 |
| 25 | 243,034,571 |
| 27 | 228,547,612 |
| 28 | 228,439,351 |
| 30 | 228,439,351 |
| 32 | 228,517,830 |
| 33 | 228,439,351 |
| 35 | 228,439,351 |
| 37 | 223,651,499 |
| 38 | 223,516,739 |
| 40 | 219,356,029 |
| 42 | 212,920,664 |
| 43 | 208,092,043 |
| 45 | 199,722,825 |
| 47 | 195,915,711 |
| 48 | 195,805,158 |
| 50 | 195,805,158 |
| 52 | 195,907,040 |
| 53 | 195,805,158 |
| 55 | 195,805,158 |
| 57 | 195,898,013 |
| 58 | 195,805,158 |
| 60 | 195,805,158 |
| 62 | 195,889,598 |
| 63 | 195,805,158 |
| 64 | 195,805,158 |
| 65 | 195,805,158 |
| 67 | 195,885,241 |
| 68 | 195,805,158 |
| 70 | 195,805,158 |
| 72 | 195,879,055 |
| 73 | 194,367,268 |
| 75 | 190,958,776 |
| 77 | 191,011,592 |
| 78 | 190,882,546 |
| 80 | 187,124,505 |
| 82 | 187,204,256 |
| 83 | 187,123,305 |
| 85 | 182,917,078 |
| 87 | 182,990,144 |
| 88 | 180,645,181 |
| 90 | 179,624,926 |
| 93 | 175,425,614 |
| 94 | 169,366,577 |
| 95 | 168,763,050 |
| 98 | 165,907,507 |
| 99 | 164,983,777 |
| 100 | 163,170,965 |
| 103 | 163,170,965 |
| 104 | 163,277,825 |
| 105 | 163,170,965 |
| 108 | 163,170,965 |
| 109 | 163,276,820 |
| 110 | 163,170,965 |
| 113 | 163,170,965 |
| 114 | 163,275,757 |
| 115 | 163,170,965 |
| 116 | 163,170,965 |
| 118 | 163,170,965 |
| 119 | 163,274,570 |
| 120 | 163,170,965 |
| 123 | 163,170,965 |
| 124 | 163,273,276 |
| 125 | 163,170,965 |
| 128 | 163,170,965 |
| 129 | 163,272,125 |
| 130 | 163,170,965 |
| 133 | 163,170,965 |
| 134 | 163,270,251 |
| 135 | 163,170,965 |
| 138 | 163,170,965 |
| 139 | 163,269,226 |
| 140 | 163,170,965 |
| 143 | 163,170,965 |
| 144 | 163,267,162 |
| 145 | 163,170,965 |
| 148 | 163,170,965 |
| 149 | 163,264,829 |
| 150 | 163,170,965 |
| 153 | 163,170,965 |
| 154 | 163,263,470 |
| 155 | 163,170,965 |
| 158 | 163,170,965 |
| 159 | 163,261,247 |
| 160 | 163,170,965 |
| 163 | 163,170,965 |
| 164 | 163,258,526 |
| 165 | 163,170,965 |
| 168 | 163,170,965 |
| 169 | 163,256,339 |
| 170 | 163,170,965 |
| 173 | 163,170,965 |
| 174 | 163,254,144 |
| 175 | 163,170,965 |
| 178 | 163,170,965 |
| 179 | 163,252,143 |
| 180 | 163,170,965 |
| 183 | 163,170,965 |
| 184 | 163,250,426 |
| 185 | 163,170,965 |
| 188 | 163,170,965 |
| 189 | 163,249,290 |
| 190 | 163,170,965 |
| 193 | 161,170,965 |
| 194 | 163,247,248 |
| 195 | 163,170,965 |
| 198 | 161,170,965 |
| 199 | 163,245,596 |
| 200 | 163,170,965 |
| 203 | 161,170,965 |
| 204 | 163,242,992 |
| 205 | 163,170,965 |
| 208 | 161,170,965 |
| 209 | 163,241,649 |
| 210 | 163,170,965 |
| 213 | 161,782,440 |
| 214 | 161,288,708 |
| 215 | 159,714,359 |
| 218 | 158,324,583 |
| 219 | 158,403,524 |
| 220 | 158,324,583 |
| 223 | 158,303,645 |
| 224 | 158,382,425 |
| 225 | 158,303,645 |
| 228 | 158,298,845 |
| 229 | 158,376,821 |
| 230 | 158,248,353 |

APPENDIX III-continued

| Base of Data File | Size in Bytes |
|---|---|
| 233 | 158,248,353 |
| 234 | 158,325,926 |
| 235 | 154,985,244 |
| 238 | 154,490,312 |
| 239 | 154,575,628 |
| 240 | 154,490,312 |
| 243 | 154,489,112 |
| 244 | 154,574,011 |
| 245 | 154,489,112 |

APPENDIX IV

```
(*
 * File name - bibl_alphabet.sml
 * Custom alphabet for the bible.
 *)
val AlphaBet=
(
  "0123456789"    (* 0 -> 9 *) (*ASCII: 48-57*)
(* 1         2         3
 * 012345678901234567890123456 *)
  "ABCDEFGHIJKLMNOPQRSTUVWXYZ"^ (*ASCII: 65-90*)
(* 3         4         5         6
 *  67890123456789012345678901 *)
  "abcdefghijklmnopqrstuvwxyz"^ (*ASCII: 97-122*)
  "$"^            (*62*)
  "#"^            (*63*)
  "%"^            (*64*)
  "@"^            (*65*)
  "/"^            (*66*)
  "["^            (*67*)
  "\""^           (*68*)
  "-"^            (*69*)
  "*"^            (*70*)
  "("^            (*71*)
  "!"^            (*72*)
  "'"^            (*73*)
  "?"^            (*74*)
  "."^            (*75*)
  ";"^            (*76*)
  ":"^            (*77*)
  ","^            (*78*)
  "_"^            (*79*)
  ")"^            (*80*)
  "]"^            (*81*)
  "+"^            (*82*)
  "="^            (*83*)
  "<"^            (*84*)
  ">"^            (*85*)
  " "^            (*86*)
  "&"^            (*87*)
  "^"^            (*88*)
  "`"^            (*89*)
  "{"^            (*90*)
  "|"^            (*91*)
  "}"^            (*92*)
  "\\"^           (*93*)
(* Extended ASCII & " " *)
  "\128"^         (*94*)
  "\129"^         (*95*)
  "\130"^         (*96*)
  "\131"^         (*97*)
  "\132"^         (*98*)
  "\133"^         (*99*)
  "\134"^         (*100*)
  "\135"^         (*101*)
  "\136"^         (*102*)
  "\137"^         (*103*)
  "\138"^         (*104*)
  "\139"^         (*105*)
  "\140"^         (*106*)
  "\141"^         (*107*)
  "\142"^         (*108*)
  "\143"^         (*109*)
  "\144"^         (*110*)
  "\145"^         (*111*)
  "\146"^         (*112*)
  "\147"^         (*113*)
  "\148"^         (*114*)
  "\149"^         (*115*)
  "\150"^         (*116*)
  "\151"^         (*117*)
  "\152"^         (*118*)
  "\153"^         (*119*)
  "\154"^         (*120*)
  "\155"^         (*121*)
  "\156"^         (*122*)
  "\157"^         (*123*)
  "\158"^         (*124*)
  "\159"^         (*125*)
  "\160"^         (*126*)
  "\161"^         (*127*)
  "\162"^         (*128*)
  "\163"^         (*129*)
  "\164"^         (*130*)
  "\165"^         (*131*)
  "\166"^         (*132*)
  "\167"^         (*133*)
  "\168"^         (*134*)
  "\169"^         (*135*)
  "\170"^         (*136*)
  "\171"^         (*137*)
  "\172"^         (*138*)
  "\173"^         (*139*)
  "\174"^         (*140*)
  "\175"^         (*141*)
  "\176"^         (*142*)
  "\177"^         (*143*)
  "\178"^         (*144*)
  "\179"^         (*145*)
  "\180"^         (*146*)
  "\181"^         (*147*)
  "\182"^         (*148*)
  "\183"^         (*149*)
  "\184"^         (*150*)
  "\185"^         (*151*)
  "\186"^         (*152*)
  "\187"^         (*153*)
  "\188"^         (*154*)
  "\189"^         (*155*)
  "\190"^         (*156*)
  "\191"^         (*157*)
  "\192"^         (*158*)
  "\193"^         (*159*)
  "\194"^         (*160*)
  "\195"^         (*161*)
  "\196"^         (*162*)
  "\197"^         (*163*)
  "\198"^         (*164*)
  "\199"^         (*165*)
  "\200"^         (*166*)
  "\201"^         (*167*)
  "\202"^         (*168*)
  "\203"^         (*169*)
  "\204"^         (*170*)
  "\205"^         (*171*)
  "\206"^         (*172*)
  "\207"^         (*173*)
  "\208"^         (*174*)
  "\209"^         (*175*)
  "\210"^         (*176*)
  "\211"^         (*177*)
  "\212"^         (*178*)
  "\213"^         (*179*)
  "\214"^         (*180*)
  "\215"^         (*181*)
  "\216"^         (*182*)
  "\217"^         (*183*)
  "\218"^         (*184*)
  "\219"^         (*185*)
  "\220"^         (*186*)
  "\221"^         (*187*)
  "\222"^         (*188*)
  "\223"^         (*189*)
  "\224"^         (*190*)
```

APPENDIX IV-continued

```
"\225"^       (*191*)
"\226"^       (*192*)
"\227"^       (*193*)
"\228"^       (*194*)
"\229"^       (*195*)
"\230"^       (*196*)
"\231"^       (*197*)
"\232"^       (*198*)
"\233"^       (*199*)
"\234"^       (*200*)
"\235"^       (*201*)
"\236"^       (*202*)
"\237"^       (*203*)
"\238"^       (*204*)
"\239"^       (*205*)
"\240"^       (*206*)
"\241"^       (*207*)
"\242"^       (*208*)
"\243"^       (*209*)
"\244"^       (*210*)
"\245"^       (*211*)
"\246"^       (*212*)
"\247"^       (*213*)
"\248"^       (*214*)
"\249"^       (*215*)
"\250"^       (*216*)
"\251"^       (*217*)
"\252"^       (*218*)
"\253"^       (*219*)
"\254"^       (*220*)
"\255"^       (*221*)
(* Other non-printable characers from basic ASCII *)
"\001"^       (*222*)
"\002"^       (*223*)
"\003"^       (*224*)
"\004"^       (*225*)
"\005"^       (*226*)
"\006"^       (*227*)
"\007"^       (*228*)
"\008"^       (*229*)
"\014"^       (*230*)
"\015"^       (*231*)
"\016"^       (*232*)
"\017"^       (*233*)
"\018"^       (*234*)
"\019"^       (*235*)
"\020"^       (*236*)
"\021"^       (*237*)
"\022"^       (*238*)
"\023"^       (*239*)
"\024"^       (*240*)
"\025"^       (*241*)
"\026"^       (*242*)
"\027"^       (*243*)
"\028"^       (*244*)
"\029"^       (*245*)
"\030"^       (*246*)
"\031"^       (*247*)
" "    (*[SPACE / ASC 32] *)   (*248*)
"\127"^       (*249*)
"\012"   [FF]        (*250*)
"\009"   [TAB]       (*251*)
"\010"   [NL]        (*252*)
"\011"^              (*253*)
"\013"   [CR]        (*254*)
"\000"               (*255*)
*)
);
```

APPENDIX V

| Base of Data File | Size in Megabytes |
|---|---|
| 2 | 21,982,207 |
| 3 | 13,891,885 |
| 4 | 11,226,719 |
| 5 | 9,700,112 |
| 6 | 8,752,700 |
| 7 | 8,058,622 |
| 8 | 7,674,147 |
| 9 | 7,009,352 |
| 10 | 6,902,673 |
| 11 | 6,704,089 |
| 12 | 6,500,949 |
| 13 | 6,245,138 |
| 14 | 6,052,972 |
| 15 | 5,950,329 |
| 16 | 5,804,322 |
| 17 | 5,671,090 |
| 18 | 5,569,445 |
| 19 | 5,400,268 |
| 20 | 5,375,653 |
| 21 | 5,345,009 |
| 22 | 5,269,662 |
| 23 | 5,141,684 |
| 24 | 5,087,990 |
| 25 | 5,038,414 |
| 26 | 4,928,603 |
| 27 | 4,882,851 |
| 28 | 4,863,598 |
| 29 | 4,853,961 |
| 30 | 4,820,869 |
| 31 | 4,761,423 |
| 32 | 4,729,808 |
| 33 | 4,632,875 |
| 34 | 4,611,284 |
| 35 | 4,601,535 |
| 36 | 4,579,583 |
| 37 | 4,537,091 |
| 38 | 4,516,511 |
| 39 | 4,458,061 |
| 40 | 4,448,721 |
| 41 | 4,433,879 |
| 42 | 4,413,744 |
| 43 | 4,395,477 |
| 44 | 4,368,141 |
| 45 | 4,351,424 |
| 46 | 4,341,766 |
| 47 | 4,324,287 |
| 48 | 4,314,876 |
| 49 | 4,303,444 |
| 50 | 4,292,579 |
| 51 | 4,280,549 |
| 52 | 4,271,864 |
| 53 | 4,267,454 |
| 54 | 4,259,534 |
| 55 | 4,256,432 |
| 56 | 4,251,285 |
| 57 | 4,240,193 |
| 58 | 4,225,703 |
| 59 | 4,222,702 |
| 60 | 4,220,041 |
| 61 | 4,215,819 |
| 62 | 4,200,104 |
| 63 | 4,173,527 |
| 64 | 4,172,134 |
| 65 | 4,166,924 |
| 66 | 4,104,159 |
| 67 | 4,057,680 |
| 68 | 4,052,626 |
| 69 | 4,041,945 |
| 70 | 4,006,507 |
| 71 | 3,991,208 |
| 72 | 3,972,151 |
| 73 | 3,942,034 |
| 74 | 3,910,111 |
| 75 | 3,819,009 |
| 76 | 3,783,581 |
| 77 | 3,765,267 |
| 78 | 3,695,438 |
| 79 | 3,638,504 |
| 80 | 3,579,452 |
| 81 | 3,541,959 |
| 82 | 3,518,685 |
| 83 | 3,501,749 |

APPENDIX V-continued

| Base of Data File | Size in Megabytes |
| --- | --- |
| 84 | 3,495,685 |
| 85 | 3,494,789 |
| 86 | 3,494,773 |
| 87 | 3,494,772 |
| 88 | 3,490,454 |
| 89 | 3,487,582 |
| 90 | 3,485,921 |
| 91 | 3,485,705 |
| 92 | 3,485,705 |
| 93 | 3,485,705 |
| 94 | 3,485,705 |
| 95 | 3,485,705 |
| 96 | 3,485,704 |
| 97 | 3,485,704 |
| 98 | 3,485,703 |
| 99 | 3,485,703 |
| 100 | 3,485,703 |
| 101 | 3,485,702 |
| 102 | 3,485,692 |
| 103 | 3,485,691 |
| 104 | 3,484,247 |
| 105 | 3,481,838 |
| 106 | 3,481,824 |
| 107 | 3,481,800 |
| 108 | 3,480,767 |
| 109 | 3,480,713 |
| 110 | 3,480,428 |
| 111 | 3,479,332 |
| 112 | 3,478,668 |
| 113 | 3,478,507 |
| 114 | 3,478,317 |
| 115 | 3,477,184 |
| 116 | 3,475,883 |
| 117 | 3,475,257 |
| 118 | 3,474,418 |
| 119 | 3,473,612 |
| 120 | 3,472,811 |
| 121 | 3,471,605 |
| 122 | 3,469,583 |
| 123 | 3,468,924 |
| 124 | 3,466,391 |
| 125 | 3,465,466 |
| 126 | 3,463,824 |
| 127 | 3,461,979 |
| 128 | 3,460,997 |
| 129 | 3,459,768 |
| 130 | 3,458,034 |
| 131 | 3,453,468 |
| 132 | 3,452,684 |
| 133 | 3,450,549 |
| 134 | 3,449,688 |
| 135 | 3,448,004 |
| 136 | 3,444,703 |
| 137 | 3,440,259 |
| 138 | 3,436,738 |
| 139 | 3,434,783 |
| 140 | 3,432,823 |
| 141 | 3,431,438 |
| 142 | 3,428,513 |
| 143 | 3,425,904 |
| 144 | 3,421,723 |
| 145 | 3,420,240 |
| 146 | 3,418,321 |
| 147 | 3,413,093 |
| 148 | 3,409,361 |
| 149 | 3,406,410 |
| 150 | 3,404,596 |
| 151 | 3,403,823 |
| 152 | 3,401,863 |
| 153 | 3,397,989 |
| 154 | 3,396,388 |
| 155 | 3,391,073 |
| 156 | 3,390,161 |
| 157 | 3,388,072 |
| 158 | 3,385,582 |
| 159 | 3,382,717 |
| 160 | 3,375,068 |
| 161 | 3,373,314 |
| 162 | 3,370,872 |
| 163 | 3,369,577 |
| 164 | 3,366,600 |
| 165 | 3,365,814 |
| 166 | 3,364,076 |
| 167 | 3,360,560 |
| 168 | 3,356,210 |
| 169 | 3,354,433 |
| 170 | 3,346,191 |
| 171 | 3,344,470 |
| 172 | 3,341,132 |
| 173 | 3,340,962 |
| 174 | 3,339,960 |
| 175 | 3,339,777 |
| 176 | 3,339,380 |
| 177 | 3,339,108 |
| 178 | 3,338,678 |
| 179 | 3,336,579 |
| 180 | 3,331,790 |
| 181 | 3,327,685 |
| 182 | 3,325,642 |
| 183 | 3,322,887 |
| 184 | 3,319,271 |
| 185 | 3,316,138 |
| 186 | 3,314,193 |
| 187 | 3,310,523 |
| 188 | 3,309,068 |
| 189 | 3,307,166 |
| 190 | 3,303,632 |
| 191 | 3,302,836 |
| 192 | 3,298,834 |
| 193 | 3,296,735 |
| 194 | 3,290,655 |
| 195 | 3,286,044 |
| 196 | 3,284,584 |
| 197 | 3,281,515 |
| 198 | 3,280,980 |
| 199 | 3,280,661 |
| 200 | 3,280,577 |
| 201 | 3,280,161 |
| 202 | 3,279,481 |
| 203 | 3,278,524 |
| 204 | 3,278,215 |
| 205 | 3,277,808 |
| 206 | 3,277,808 |
| 207 | 3,277,597 |
| 208 | 3,277,141 |
| 209 | 3,276,973 |
| 210 | 3,276,969 |
| 211 | 3,276,950 |
| 212 | 3,276,475 |
| 213 | 3,275,877 |
| 214 | 3,271,238 |
| 215 | 3,269,640 |
| 216 | 3,265,297 |
| 217 | 3,261,873 |
| 218 | 3,260,599 |
| 219 | 3,257,985 |
| 220 | 3,254,741 |
| 221 | 3,249,502 |
| 222 | 3,247,099 |
| 223 | 3,243,411 |
| 224 | 3,237,946 |
| 225 | 3,237,216 |
| 226 | 3,236,804 |
| 227 | 3,236,445 |
| 228 | 3,235,277 |
| 229 | 3,232,257 |
| 230 | 3,229,623 |
| 231 | 3,228,115 |
| 232 | 3,227,686 |
| 233 | 3,226,145 |
| 234 | 3,224,405 |
| 235 | 3,223,852 |
| 236 | 3,222,053 |
| 237 | 3,201,174 |
| 238 | 3,184,039 |
| 239 | 3,182,563 |

APPENDIX V-continued

| Base of Data File | Size in Megabytes |
| --- | --- |
| 240 | 3,181,547 |
| 241 | 3,170,751 |
| 242 | 3,166,394 |
| 243 | 3,164,403 |
| 244 | 3,164,098 |
| 245 | 3,163,546 |
| 246 | 3,162,987 |
| 247 | 3,162,709 |

What is claimed is:

1. A system, comprising: a computing device configured to:
    determine a first base of representation of a data set according to a number of distinct characters in the data set;
    convert the data set from the first base of representation to a second base of representation, thereby generating a set of base-converted data; and
    encode the base-converted data according to a fix-length encoding scheme.

2. The system of claim 1, the computing device being further configured to store the distinct characters.

3. The system of claim 2, the computing device being further configured to store, along with the distinct characters, at least one additional character that is not included in the data set.

4. The system of claim 2, the computing device being further configured to use the stored distinct characters to convert the data set from the first base of representation to the second base of representation.

5. The system of claim 1, wherein the second base of representation is a higher base of representation than the first base of representation.

6. The system of claim 5, wherein the second base of representation comprises a maximum power of the first base of representation that is less than or equal to $2^n$, wherein n is equal to a length of the fixed-length encoding scheme.

7. The system of claim 1, the computing device being further configured to convert the base-converted data to the first base of representation.

8. The system of claim 1, wherein the data set comprises at least one of decimal data and a text file.

9. A method, comprising:
    determining, in a computing device, a first base of representation of a data set according to a number of distinct characters in the data set;
    converting the data set from the first base of representation to a second base of representation, thereby generating a set of base-converted data; and
    encoding the base-converted data according to a fix-length encoding scheme.

10. The method of claim 9, further comprising storing the distinct characters.

11. The method of claim 10, further comprising storing, along with the distinct characters, at least one additional character that is not included in the data set.

12. The method of claim 10, further comprising using the stored distinct characters when converting the data set from the first base of representation to the second base of representation.

13. The method of claim 9, wherein the second base of representation is a higher base of representation than the first base of representation.

14. The method of claim 13, wherein the second base of representation comprises a maximum power of the first base of representation that is less than or equal to $2^n$, wherein n is equal to a length of the fixed-length encoding scheme.

15. The method of claim 9, further comprising converting the base-converted data to the first base of representation.

16. The method of claim 9, wherein the data set comprises at least one of decimal data and a text file.

17. A non-transitory computer-readable medium tangibly embodying computer-executable instructions, the instructions comprising instructions for:
    determining, in a computing device, a first base of representation of a data set according to a number of distinct characters in the data set;
    converting the data set from the first base of representation to a second base of representation, thereby generating a set of base-converted data; and
    encoding the base-converted data according to a fix-length encoding scheme.

18. The medium of claim 17, the instructions further comprising instructions for storing the distinct characters.

19. The medium of claim 18, the instructions further comprising instructions for storing, along with the distinct characters, at least one additional character that is not included in the data set.

20. The medium of claim 18, the instructions further comprising instructions for using the stored distinct characters when converting the data set from the first base of representation to the second base of representation.

21. The medium of claim 17, wherein the second base of representation is a higher base of representation than the first base of representation.

22. The medium of claim 21, wherein the second base of representation comprises a maximum power of the first base of representation that is less than or equal to $2^n$, wherein n is equal to a length of the fixed-length encoding scheme.

23. The medium of claim 17, the instructions further comprising instructions for converting the base-converted data to the first base of representation.

24. The medium of claim 17, wherein the data set comprises at least one of decimal data and a text file.

* * * * *